United States Patent [19]
Seher et al.

[11] Patent Number: 5,535,250
[45] Date of Patent: Jul. 9, 1996

[54] DEVICE FOR MANIPULATING A SYNCHROTRON BEAM BUNDLE

[75] Inventors: Bernd Seher; Frank Reuther; Lutz Mueller, all of Jena, Germany

[73] Assignee: Jenoptik Technologie GmbH, Jena, Germany

[21] Appl. No.: 375,415

[22] Filed: Jan. 18, 1995

[30] Foreign Application Priority Data

Jul. 9, 1994 [DE] Germany .......................... 44 24 274.3

[51] Int. Cl.⁶ .................................................... G21K 1/02
[52] U.S. Cl. ............................................. 378/34; 378/157
[58] Field of Search ............................... 378/34, 145, 147, 378/150, 151, 152, 156, 157, 158

[56] References Cited

U.S. PATENT DOCUMENTS

| | | |
|---|---|---|
| 4,856,037 | 8/1989 | Mueller et al. . |
| 5,371,774 | 12/1994 | Cerrina et al. .............. 378/34 |

FOREIGN PATENT DOCUMENTS

| | | | |
|---|---|---|---|
| 8016658 | 10/1980 | Germany . | |
| 3311870 | 10/1983 | Germany . | |
| 4229319 | 3/1994 | Germany .............. | 378/158 |
| 2-234498 | 9/1990 | Japan .................... | 378/34 |
| 4-96214 | 3/1992 | Japan .................... | 378/158 |
| 5-74688 | 3/1993 | Japan .................... | 378/34 |
| 5-175103 | 7/1993 | Japan .................... | 378/34 |

OTHER PUBLICATIONS

LIGA process, "Microelectronic Engineering", vol. 4, No. 1, May 1986, pp. 35–56.

*Primary Examiner*—David P. Porta
*Attorney, Agent, or Firm*—McAulay Fisher Nissen Goldberg & Kiel

[57] ABSTRACT

A device for manipulating a synchrotron beam bundle is intended to produce properties of the beam bundle, under vacuum conditions, which are adapted to the respective application of deep X-ray lithography, in particular, which are adapted to the scanning regimen. Pairs of diaphragms which are displaceable relative to one another are provided between the object table and an inlet window within a vacuum chamber containing an object table for receiving an object to be irradiated, which object table is adjustable by a scanning movement relative to the synchrotron beam bundle. The pair of diaphragms for which the direction of relative displacement of the diaphragms coincides with the scanning movement is coupled with the scanning movement. Further, a filter chamber is arranged upstream of the vacuum chamber and contains filters which can be inserted into the synchrotron beam bundle. The device is for use in irradiating equipment for deep X-ray lithography which are used to fabricate microsystems components by means of a technique known as the LIGA process (lithography with synchrotron radiation, electroforming and plastics molding).

6 Claims, 5 Drawing Sheets

5,535,250

DEVICE FOR MANIPULATING A SYNCHROTRON BEAM BUNDLE

BACKGROUND OF THE INVENTION a) Field of the Invention

The present invention is directed to a device for manipulating a bundle of synchrotron rays, in particular in irradiating apparatuses for deep X-ray lithography which contain within a vacuum chamber an object table for receiving an object to be irradiated, which object table is adjustable by means of a scanning movement relative to the synchrotron beam bundle entering the vacuum chamber via a window.

b) Description of the Related Art

Such irradiating devices can be used to fabricate microsystems components by means of a technique known as the LIGA process (lithography with synchrotron radiation, electroforming and plastics molding) (LIGA process, *Microelectronic Engineering* 4 (1986) 35–56).

In this process, a resist layer is exposed directly by synchrotron radiation in the deep X-ray lithography process step by masking with an X-ray mask. To this end, the X-ray mask and the resist layer applied to the substrate are arranged on an object table which is adjustable in a scanning movement relative to the synchrotron beam bundle. The dimensions of the object table are typically approximately 100 mm in the horizontal direction and approximately 5 mm in the vertical direction.

As a result of the action of radiation in the non-masked regions, the structure of the resist is changed in such a way that the exposed surfaces of the resist layer can be dissolved in a subsequent development process. Since the synchrotron beam bundle has substantially constant characteristics with respect to its dimensions and spectral properties, modifications are required for the multitude of different applications. These modifications must be carried out under vacuum conditions and may not have a disruptive influence on the exposure process itself. For example, overexposure at the reversal points of the scanning movement must be eliminated in particular.

OBJECT AND SUMMARY OF THE INVENTION

Therefore, a primary object of the present invention is to produce, under vacuum conditions, properties of the beam bundle which are adapted to the respective case of application for deep X-ray lithography, in particular which are adapted to the scanning regimen.

In a device for manipulating a synchrotron beam bundle, in particular in irradiating apparatuses for deep X-ray lithography containing within a vacuum chamber an object table for receiving an object to be irradiated, which object table is adjustable by a scanning movement relative to the synchrotron beam bundle entering the vacuum chamber via a window, the proposed object is met according to the invention in that pairs of diaphragms which are displaceable relative to one another are provided between the object table and window adjacent to a filter chamber which is connected upstream of the vacuum chamber and contains filters which can be inserted into the synchrotron beam bundle, and the pair of diaphragms for which the direction of relative displacement of the diaphragms coincides with the scanning movement is coupled with the scanning movement.

Filter changers are advantageously provided for inserting the filters into the synchrotron beam bundle, a pneumatic cylinder being fastened via stay rods to a vacuum flange which can be arranged on the filter chamber. The movement of the pneumatic cylinder is transmitted to a connecting rod by means of a rod linkage which extends into a guide bush and membrane bellows, a filter holder being fastened to the connecting rod. The filter holder can have two frame members which are provided with an elongated aperture adapted to the cross section of the synchrotron beam bundle.

In an advantageous manner, one pair of diaphragms which are displaceable relative to one another forms a component part of a first beam limiting unit which limits the synchrotron beam bundle horizontally. For each of the diaphragms which are displaceable relative to one another, a guide rail is rigidly supported on a mounting plate and a spindle is rotatably supported on the mounting plate via holding elements, and a spindle nut which is fixed relative to rotation on the spindle carries one of the diaphragms. Sensors which are fastened to the mounting plate serve for positioning the diaphragms.

The other pair of diaphragms which are displaceable relative to one another should form a component part of a second beam limiting unit which limits the synchrotron beam bundle vertically and in which the displacement of the diaphragms is carried out by driving members which substantially correspond to those driving the diaphragms and are fastened to the movable part of the object table.

Apart from the selective spectral filtering, the device according to the invention at the same time realizes an edge limiting of the synchrotron beam bundle so as to rule out overexposure at the reversal points of the object table.

For a better understanding of the present invention, reference is made to the following description and accompanying drawings while the scope of the invention will be pointed out in the appended claims.

DESCRIPTION OF THE PREFERRED EMBODIMENTS

Figure 1:
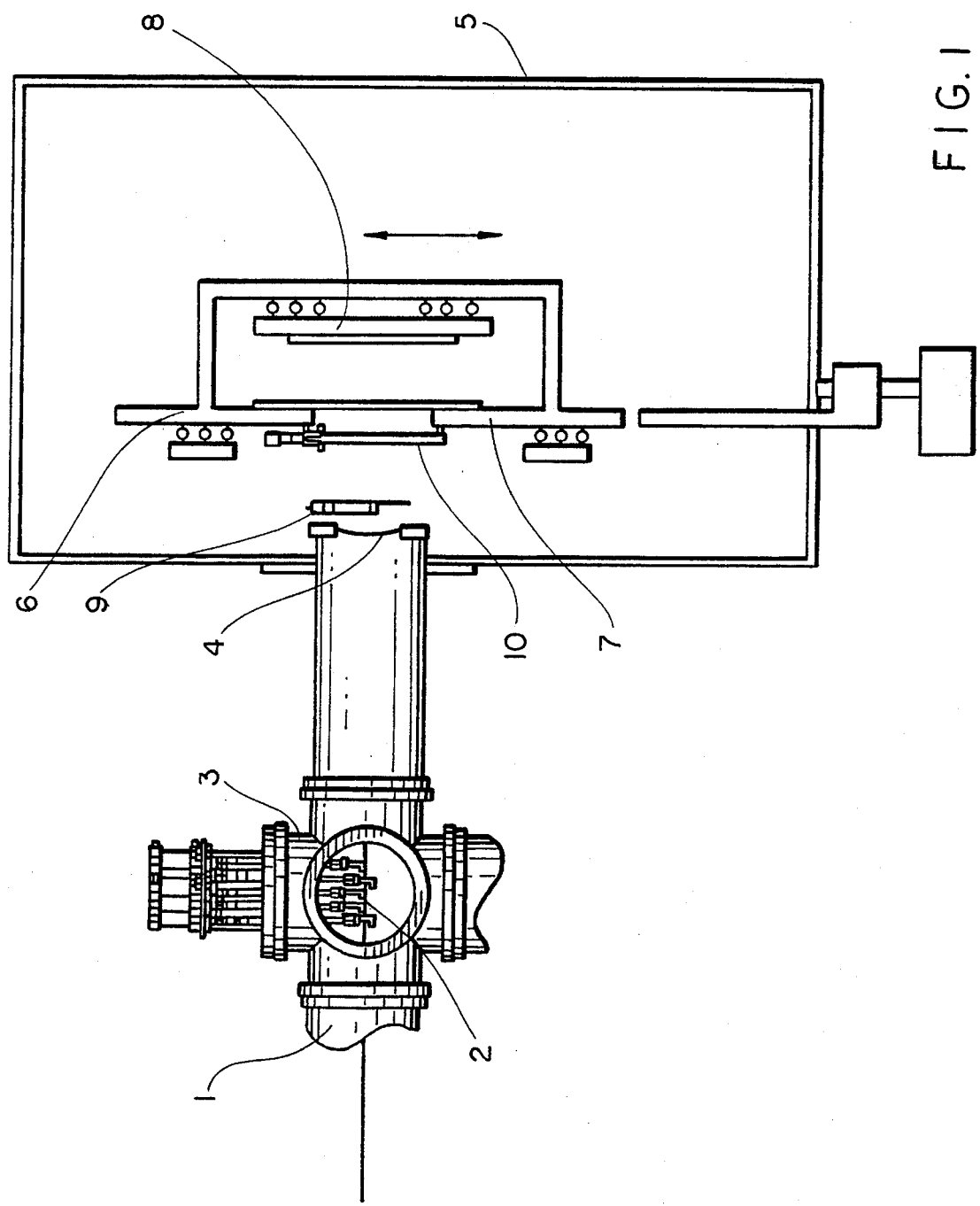
FIG. 1 shows an irradiating apparatus for deep X-ray lithography.
Figure 4:
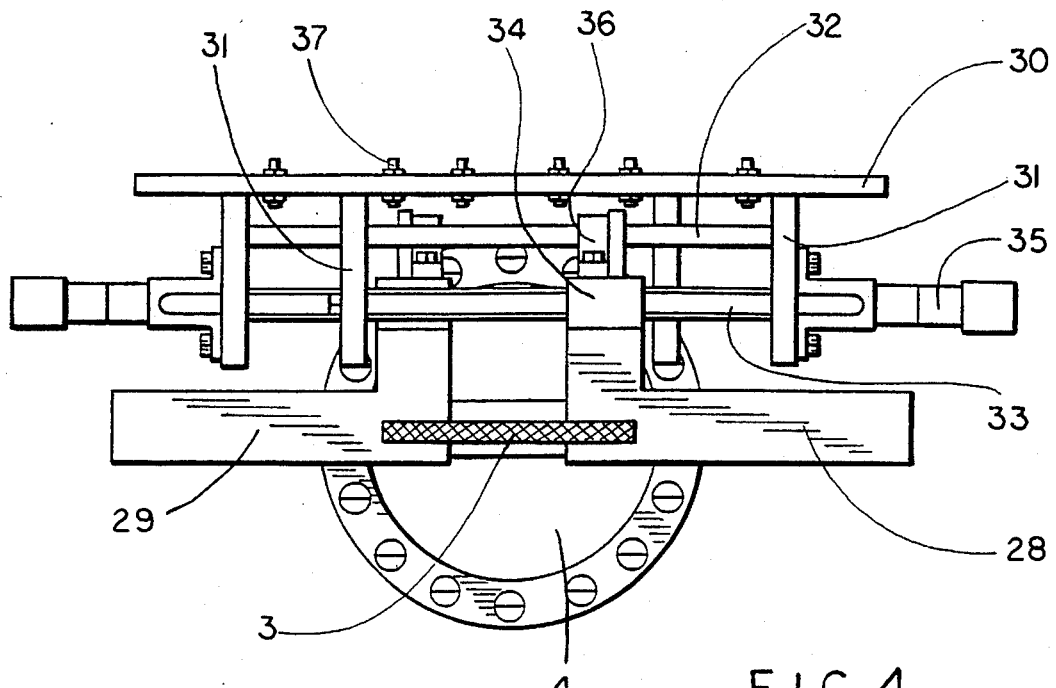
FIG. 4 shows a horizontally acting beam limiting unit as viewed opposite the direction of radiation.
Figure 5:
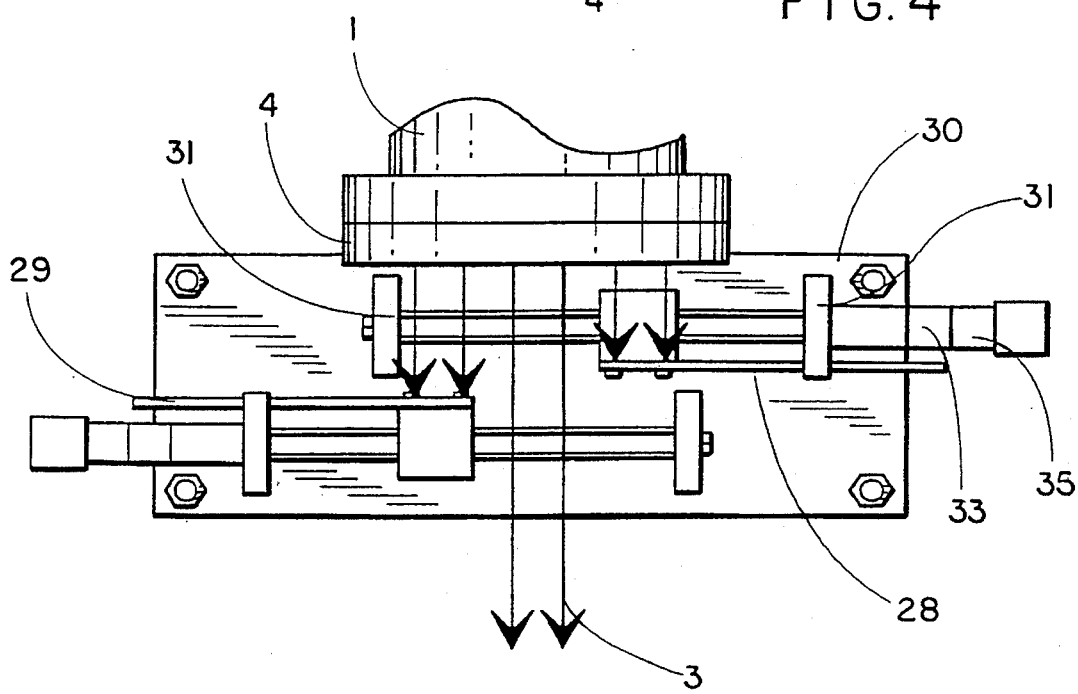
FIG. 5 shows a top view of the beam limiting unit according to FIG. 4.
Figure 6:
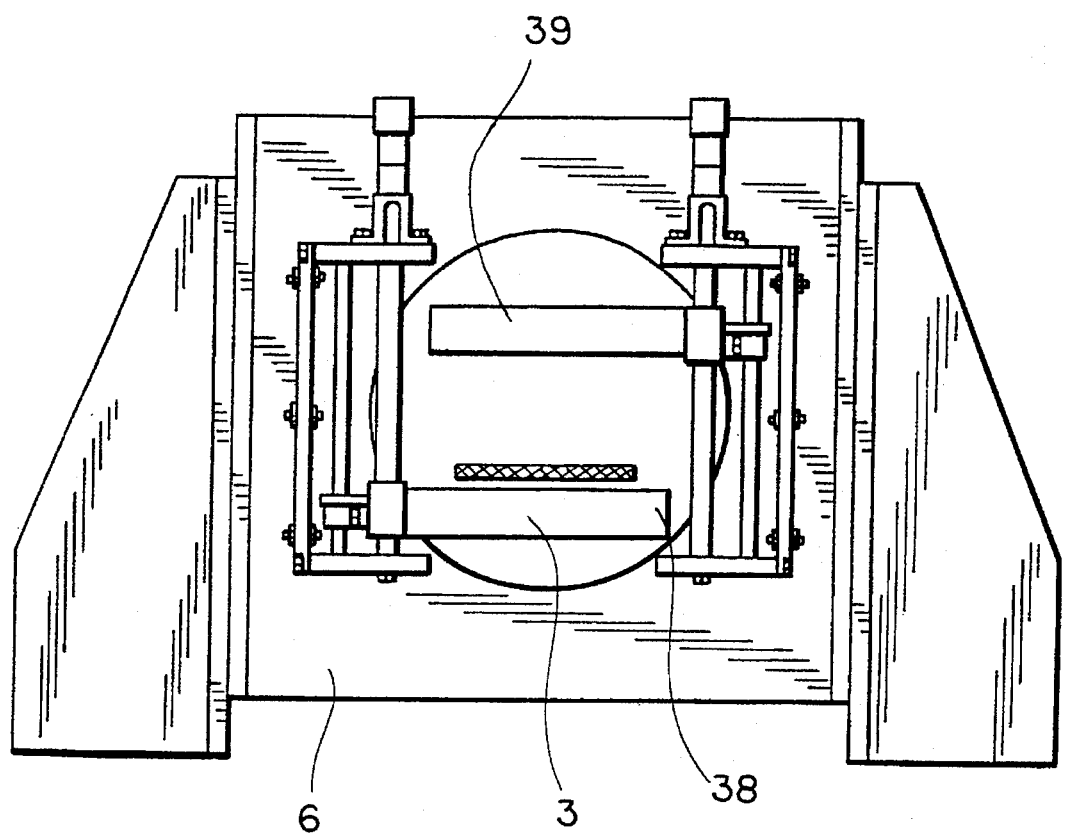
FIG. 6 shows a vertically acting beam limiting unit as viewed in the direction of radiation.

In the irradiating apparatus which is shown in a greatly simplified manner in FIG. 1, a ray tube 1 for a synchrotron beam bundle 2 in which a filter chamber 3 is inserted opens via a window 4 into a vacuum chamber 5 serving as a work chamber. The vacuum chamber 5 contains an externally driven object table 6 which moves an X-ray mask 7 and an X-ray-sensitive resist 8 in a vertical scanning movement relative to the beam bundle 2. Beam limiting units 9, 10 which will be described in more detail in FIGS. 4, 5 and 6 are arranged between window 4 and object table 6.

Figure 2:
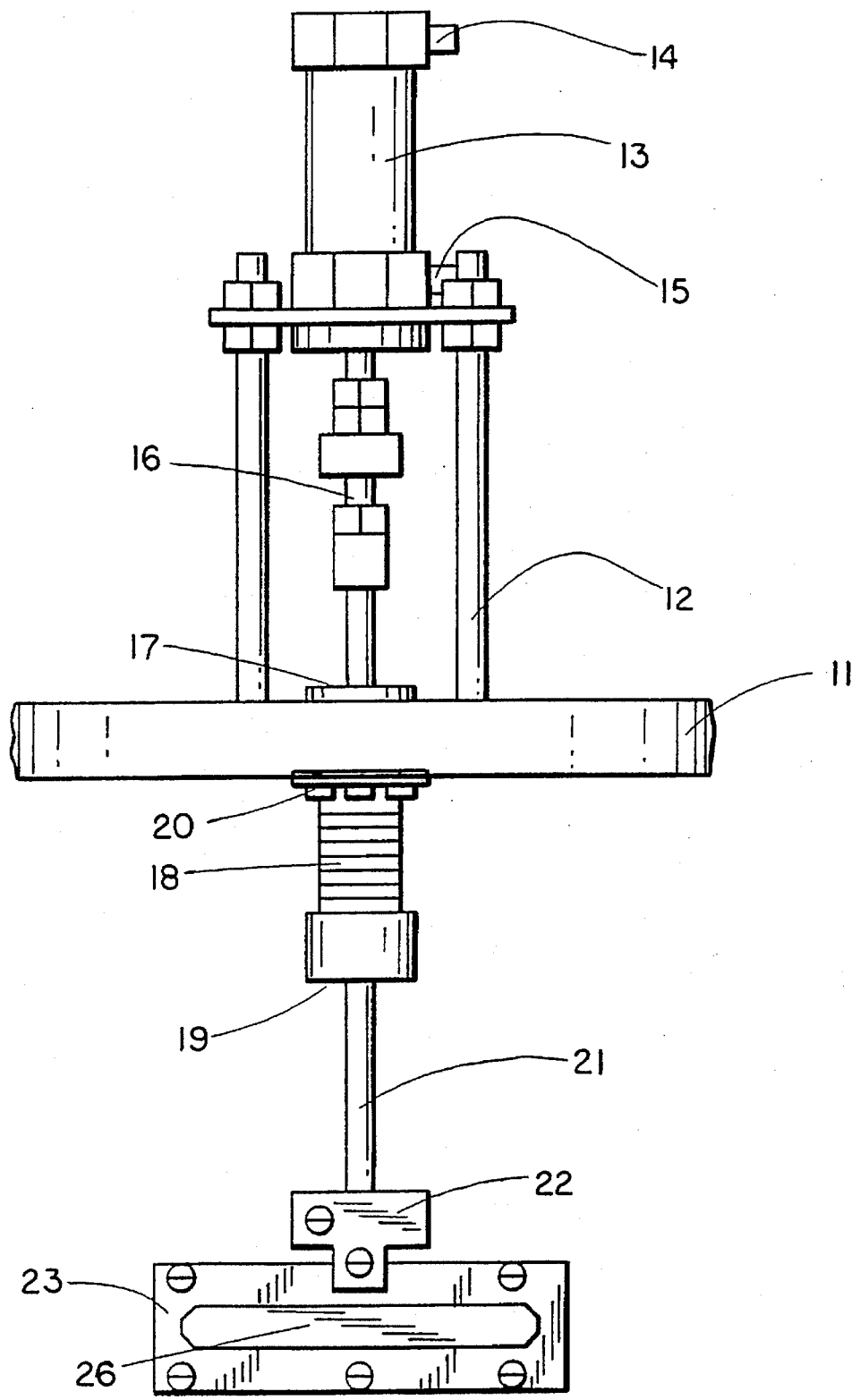
FIG. 2 shows a filter changer for a filter chamber.
Figure 3:
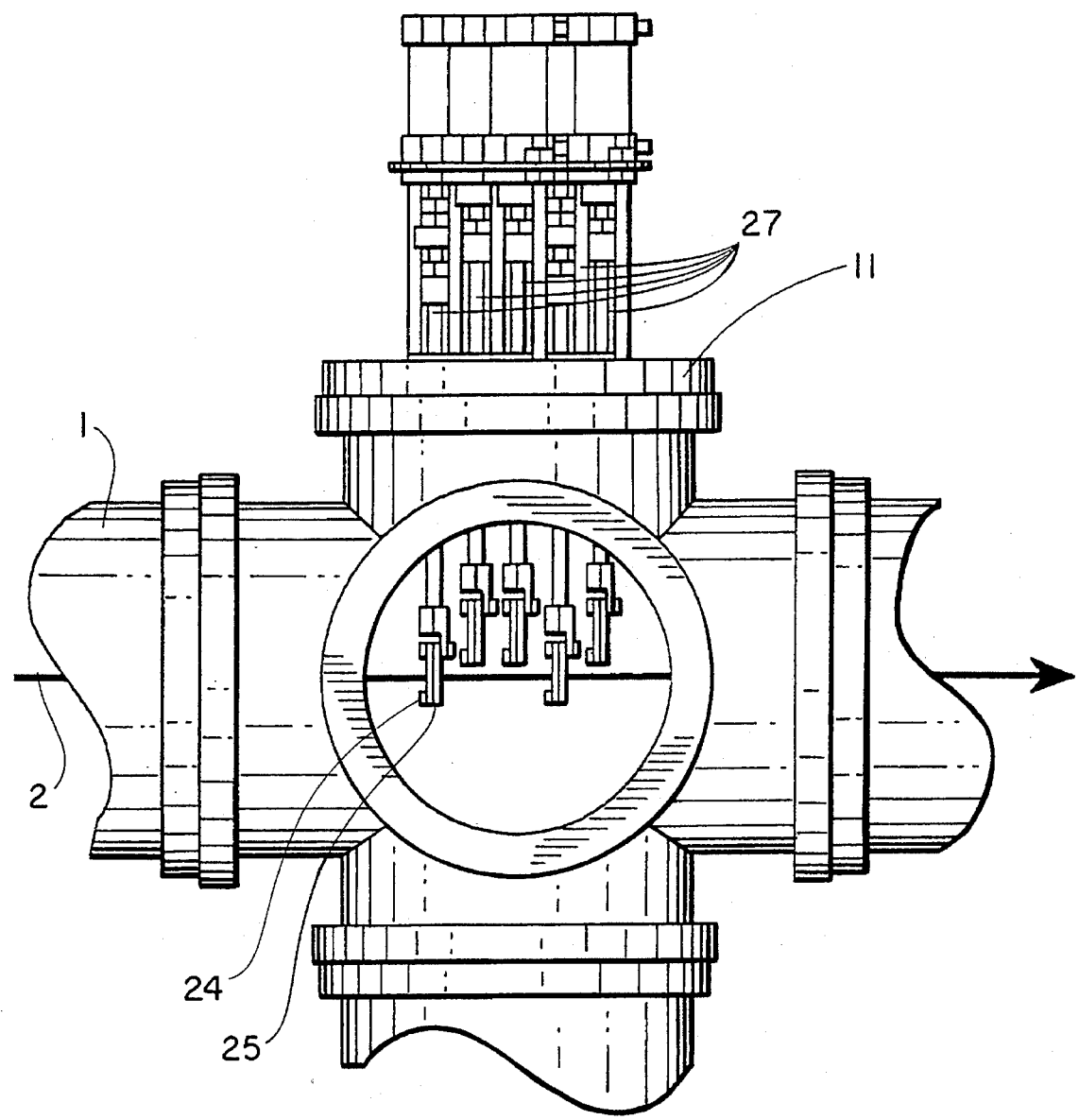
FIG. 3 shows a filter chamber suitable for use in an irradiating apparatus.

In the filter changer, shown in FIG. 2, for use in a filter chamber 3 which is shown more clearly in FIG. 3 than in FIG. 1, a pneumatic cylinder 13 of a pneumatic drive is fastened to a vacuum flange 11 via stay rods 12. The pneumatic cylinder 13 produces a translatory motion of an internal work cylinder in that an upper compressed-air inlet 14 and a lower compressed-air inlet 15 are acted upon, as needed, by compressed air, which can be controlled electrically by means of suitable electropneumatic elements. This motion is transmitted to the upper side of the vacuum flange 11 by means of a rod linkage 16. The rod linkage 16 extends within a guide bush 17 and a membrane bellows 18. The rod linkage is securely connected with that side 19 of the membrane bellows 18 which is closed so as to be vacuum-tight. The outer circumference of the other side 20 of the membrane bellows 18 is fastened in a vacuum-tight manner to the vacuum flange 11.

Discrepancies between the translation defined by the running of the work cylinder located in the interior of the pneumatic cylinder 13 and the translation defined by the movement of the rod linkage 16 in the guide bush 17 are compensated for by a suitable coupling within the rod linkage 16.

A unit having a connecting rod 21, a clamp 22 and a filter holder 23 is fastened to the lower side 19 of the membrane bellows 18 and carries out a translatory movement when the pneumatic cylinder 13 is manipulated. The filter holder 23 can be detached from or fastened to the connecting rod 21 by loosening or tightening the clamp 22. As can be seen from FIG. 3, the filter holder 23 has two frame members 24 and 25. Each of these frame members 24, 25 contains an elongated aperture 26. After loosening the screw connection, filter material in the form of films or plates can be inserted between the frame members 24, 25 and clamped by screwing.

According to FIG. 3, the filter chamber 3 which is constructed as a T-piece or cross-piece contains a plurality of (e.g., five) filter changers 27. The filter chamber 3 is so arranged in the ray tube 1 for the synchrotron beam bundle 2 that the filter holder 23 with the filter material lies outside the region of the synchrotron beam bundle 2 in the upper position of the work cylinder of a pneumatic drive and, in the other position of the work cylinder, the filter holder 23 is so disposed that the synchrotron beam bundle 2 is influenced by the filter material. The elongated aperture 26 is designed in such a way that all synchrotron radiation passes through the filter holder in the position in which no filter material is inserted. The filter can be changed automatically by means of an electropneumatic control without venting the filter chamber 3.

In the beam limiting unit 9 which, as shown in FIGS. 4 and 5, has a pair of diaphragms 28, 29 which are displaceable horizontally relative to one another, a guide rail 32 is rigidly supported and a spindle 33 is rotatably supported on a mounting plate 30 via holding members 31. A spindle nut 34 is mounted on the spindle 33. The diaphragm 28 is fastened to the spindle nut 34 and can be positioned laterally, analogous to the spindle nut 34, by the rotation of the spindle 33 produced by a motor group 35. The spindle nut 34 is locked against rotation by a coupling 36 at the guide rail 32. The diaphragm 28 can be adjusted and controlled automatically by appropriate sensors 37.

While the diaphragm 28 is so arranged with respect to the synchrotron beam bundle 2 that an optional portion starting from the right with reference to the drawing is absorbed through the diaphragm 28, the synchrotron beam bundle 2 is limited from the left by diaphragm 29 whose driving members correspond to those of diaphragm 28 and are provided with the same reference numbers for the sake of clarity. By means of the two diaphragms 28, 29, it is possible to select a section from the synchrotron beam bundle 2 which can be adjusted in width. As described herein, the movement can be effected automatically by electrical control or in simplified form by manual manipulation in simplified systems.

FIG. 6 shows the beam limiting unit 10 with a pair of diaphragms 38, 39 which are displaceable vertically relative to one another and whose translatory movement is realized by driving members corresponding to those of diaphragms 28, 29. The construction design ensures an independent adjustability between the beam limiting units 9 and 10, diaphragms 28 and 29, and diaphragms 38 and 39. The two diaphragms 38, 39 move along with the object table 6 in that they are fastened to the movable part of the object table 6 via the driving members so that when the position of diaphragm 38 is adjusted in an optional first position of the object table 6 and the position of diaphragm 39 is adjusted in an optional second position of the object table 6, the full intensity of the synchrotron beam bundle 3 is absorbed.

In order to produce a pattern by deep X-ray lithography, the two positions of the object table 6 can be the lower and upper reversal points of a continuous scanning movement so that overexposure of the X-ray-sensitive resist 8 is prevented in these regions and the region to be exposed is sharply delimited.

Further, a vertically limited exposure region of the X-ray-sensitive resist can be defined in an optional manner by the pair of diaphragms 38, 39 which are displaceable vertically relative to one another.

The movement can be effected automatically by means of electrical control or, in simplified form, by manual manipulation in simplified systems in the same manner as the pair of diaphragms 28, 29 which are displaceable horizontally relative to one another.

While the foregoing description and drawings represent the preferred embodiments of the present invention, it will be obvious to those skilled in the art that various changes and modifications may be made therein without departing from the true spirit and scope of the present invention.

What is claimed is:

1. A device for manipulating a synchrotron beam bundle, in irradiating apparatuses for deep X-ray lithography containing within a vacuum chamber an object table for receiving an object to be irradiated, comprising:

a vacuum chamber having a window for allowing a synchrotron beam bundle to enter said chamber;

an object table disposed within said vacuum chamber for receiving an object to be irradiated, said object being adjustable by a scanning movement relative to said synchrotron beam bundle;

a filter chamber connected upstream of the vacuum chamber and containing filters which can be inserted into the synchrotron beam bundle;

pairs of diaphragms which are displaceable relative to one another being provided between said object table and said window and adjacent to said filter chamber; and wherein a pair of said pairs of diaphragms for which the direction of relative displacement of the diaphragms coincides with the scanning movement is coupled with the scanning movement.

2. The device according to claim 1, wherein filter changers are provided for inserting the filters into the synchrotron beam bundle, wherein a pneumatic cylinder is fastened via stay rods to a vacuum flange arranged on the filter chamber, and wherein movement of the pneumatic cylinder is transmitted to a connecting rod by means of a rod linkage which passes within a guide bush and membrane bellows, a filter holder being fastened to the connecting rod.

3. The device according to claim 2, wherein the filter holder has two frame members which are provided with an elongated aperture adapted to the cross section of the synchrotron beam bundle.

4. The device according to claim 1, wherein one pair of diaphragms which are displaceable relative to one another forms a first beam limiting unit which limits the synchrotron beam bundle horizontally.

5. The device according to claim 4, wherein there is in the beam limiting unit, for each of the diaphragms which are displaceable relative to one another, a guide rail which is rigidly supported on a mounting plate and a spindle which is rotatably supported on the mounting plate via holding elements, and wherein a spindle nut which is fixed relative to rotation on the spindle carries one of the diaphragms, and wherein sensors, which are fastened to the mounting plate, are provided for positioning the diaphragms.

6. The device according to claim 4, wherein the other pair of diaphragms which are displaceable relative to one another forms a second beam limiting unit which limits the synchrotron beam bundle vertically and in which the displacement of the diaphragms is carried out by driving elements which substantially correspond to those provided for driving diaphragms and are fastened to the movable part of the object table.

* * * * *